United States Patent [19]
Alsmeier et al.

[11] Patent Number: 6,004,844
[45] Date of Patent: Dec. 21, 1999

[54] UNIT CELL LAYOUT AND TRANSFER GATE DESIGN FOR HIGH DENSITY DRAMS

[75] Inventors: Johann Alsmeier; Martin Gall, both of Wappinger Falls, N.Y.

[73] Assignee: Siemens Aktiengesellschaft, Munich, Germany

[21] Appl. No.: 08/680,765

[22] Filed: Jul. 15, 1996

Related U.S. Application Data

[62] Division of application No. 08/340,500, Nov. 15, 1994, Pat. No. 5,936,271.

[51] Int. Cl.⁶ .................................................. H01L 21/8242
[52] U.S. Cl. ............................................. 438/246; 438/389
[58] Field of Search ..................................... 438/238, 239, 438/243–249, 381, 386–392

[56] References Cited

U.S. PATENT DOCUMENTS 5,389,559  2/1995  Hsieh et al. ............................. 438/243

FOREIGN PATENT DOCUMENTS

62/299062  12/1987  Japan ............................. H01L 27/10
63-169758  7/1988  Japan ............................. H01L 27/10

*Primary Examiner*—Joni Chang
*Attorney, Agent, or Firm*—Stanton C. Braden

[57] ABSTRACT

A DRAM unit cell is disclosed which comprises a trench capacitor having a signal electrode, a bit line, a planar active word line overlapping the trench capacitor and a planar FET having a main conducting path coupled between the signal electrode of the trench capacitor and the bit line and a gate electrode formed by the active word line.

7 Claims, 6 Drawing Sheets

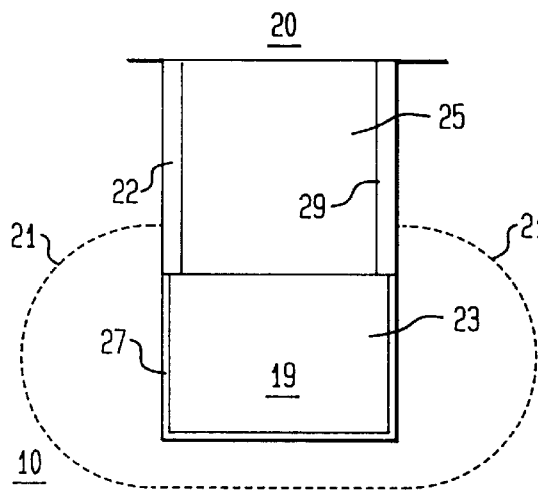
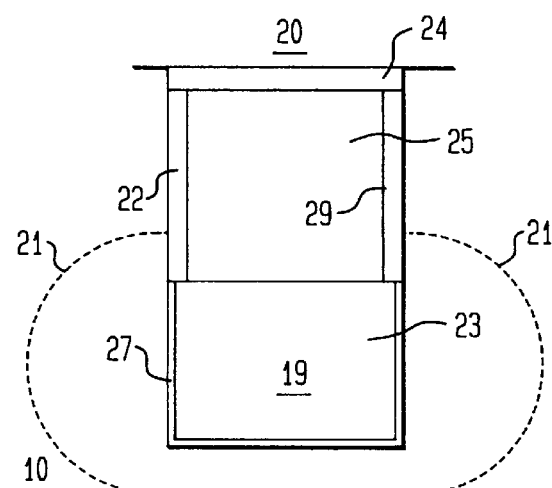
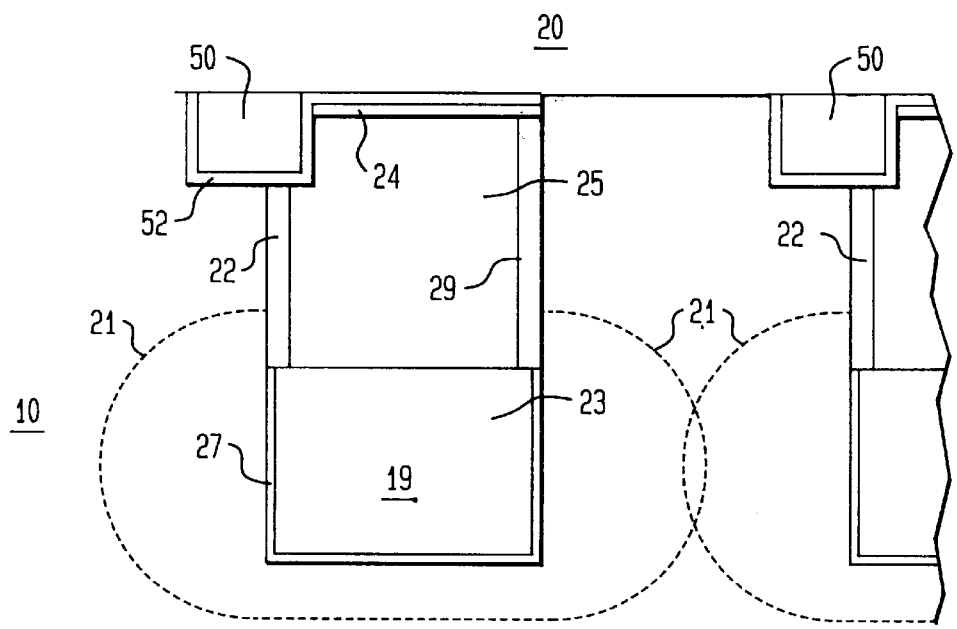

UNIT CELL LAYOUT AND TRANSFER GATE DESIGN FOR HIGH DENSITY DRAMS

This is a divisional of application Ser. No. 08/340,500 filed Nov. 15, 1994, U.S. Pat. No. 5,936,271.

The present invention relates to a layout for a dynamic random access memory (DRAM) unit cell.

A DRAM unit cell consists of a storage capacitor and an insulated gate field effect transistor (FET). The main conductive path of the FET is coupled between an electrode of the storage capacitor and a bit line. A word line is coupled to a control electrode of the FET. In some prior art unit cells, the storage capacitor is fabricated, at least partially, in a trench structure on a semiconductor substrate, allowing increased capacitor plate area without requiring additional substrate surface area. The FET is then fabricated in a planar orientation (i.e. horizontally) on the surface of the substrate. A source electrode of the FET, consisting of a diffusion area, is coupled to one plate of the trench capacitor; a drain electrode, consisting of another diffusion area, is coupled to the bit line; and a gate electrode, overlying the active area between the source and drain diffusion areas, is coupled to the word line.

In order to decrease the amount of substrate surface area required for a unit cell, some prior art unit cells have reoriented some components vertically within the substrate. In U.S. Pat. No. 5,214,603, issued May 25, 1993 to Dhong et al., the word line is oriented vertically, instead of being planar, and the FET is fabricated partially overlapping the trench capacitor. In U.S. Pat. No. 4,959,698, issued Sep. 25, 1990 to Shinichi, one illustrated embodiment (FIG. 15) shows the FET as fabricated vertically on one side wall of the trench containing the capacitor with the word line being vertically oriented and placed within the trench over the FET channel on the vertical sidewall of the trench. In another embodiment (FIG. 14) the FET has a drain region on one sidewall of the trench containing the capacitor, and a source region on the surface of the substrate adjacent the lip of the trench, with the word line having an L-shaped cross-section and placed over the lip of the trench atop the channel formed between the vertical drain region and the planar source region. In U.S. Pat. No. 4,829,017, issued May 9, 1989 to Malhi the main conducting path (source-channel-drain) of the FET is fabricated vertically atop the trench capacitor. The word line includes a stud which is placed in the horizontal center of the FET structure and which forms a central gate electrode for an annular channel forming the main conducting path of the FET vertically surrounding it. These unit cell arrangements all take decreased substrate surface area, but require substantially more complex fabrication techniques, decreasing yield and increasing costs.

The unit cells in a semiconductor memory chip are arranged in an array made up of a predetermined number of rows of unit cells with the word lines of each unit cell in a row coupled in common to an output terminal of separate addressing circuitry on the semiconductor memory chip. Each row has the same predetermined number of unit cells in it. The unit cells in the rows are further arranged in columns with the bit lines of each unit cell in a column coupled in common to external circuitry for reading information from or writing information to the unit cells.

In some prior art memory arrays, the unit cells are laid out in a folded bit line arrangement, in which each unit cell requires area for not only the active word line coupled to the gate electrode of the FET, but also for an additional passing word line, coupled to the word lines of unit cells in adjacent rows. As the area required for fabrication of unit cells is decreased, the pitch of the two word lines becomes a limiting constraint on the size of the unit cell. To overcome this constraint, some unit cells (as discussed above) were fabricated with vertically oriented active and passing word lines and/or FETS. While this resulted in some shrinkage in the unit cell dimensions, the fabrication techniques are much more complicated than that for fabricating planar word lines and FETs. This, in turn, resulted in lower yields and higher prices for semiconductor memory chips using such unit cells.

In order to meet projected demand for high density semiconductor memory chips, it is necessary that unit cells be redesigned to take up less area on the semiconductor substrate. However, it is important that the fabrication technique for such redesigned unit cells not be overly complex, so that yield is maintained as high as possible, thus, minimizing the cost of such a semiconductor chip. It is also important that the performance of such redesigned unit cells is not compromised.

A unit cell according to the present invention takes up a smaller substrate area than prior art unit cells because the word line overlaps the trench capacitor. In a unit cell according to the present invention, the limiting constraint on memory density is the trench pitch. Because the wordline overlaps the trench capacitor, the FET junction area is smaller. This results in a lower leakage current through the junction, increasing the performance of such a unit cell over prior art unit cells. Also, because both the word line and the FET are fabricated in a planar orientation, the fabrication technique for such a unit cell is relatively simpler than vertically oriented unit cell arrangements. Thus, yields are higher and costs are correspondingly lower.

In the drawing:

FIGS. 4 through 9 are cross section views of progressive stages of fabrication of a unit cell as illustrated in FIGS. 1 and 2;

The figures described below are not necessarily to scale, but are schematic to illustrate most clearly the elements of the illustrated embodiments of the unit cell according to the present invention. In addition, unless specifically indicated otherwise, the measurements given below are illustrative only, and are not critical to the fabrication or operation of the unit cell. Furthermore, the illustrated embodiment described below discloses an exemplary semiconductor substrate type and exemplary doping types and concentrations. One skilled in the art will understand that other semiconductor substrate types and doping types and concentrations may be used.

Figure 1:
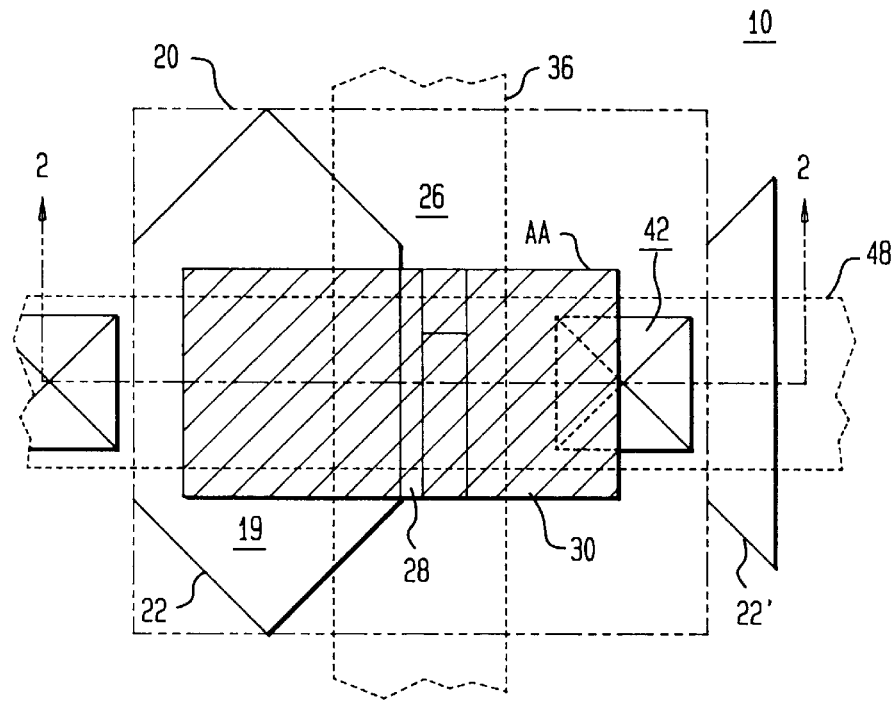
FIG. 1 is a plan view of a unit cell according to the present invention.
Figure 2:
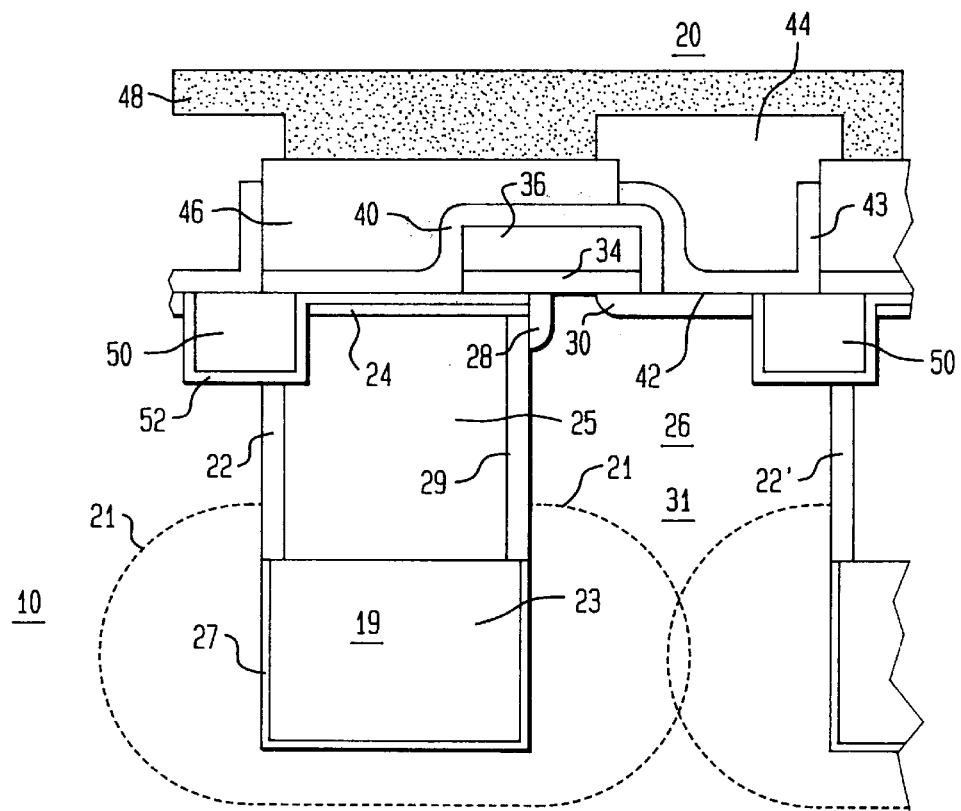
FIG. 2 is a cross section view of the unit cell whose plan view is illustrated in FIG. 1.

FIG. 1 is a plan view, and FIG. 2 is a cross section view of a unit cell 20 according to the present invention, where FIG. 2 illustrates cross section 2—2 of the plan view of FIG. 1. Corresponding elements in FIGS. 1 and 2 are designated by the same reference number. In FIGS. 1 and 2, the unit cell 20 is fabricated on a P-type substrate 10. In FIG. 1, the periphery of a unit cell 20 is indicated by a dashed box. This box indicates only the relative periphery of the unit cell 20 and does not indicate the boundaries of any areas on the substrate 10. A storage capacitor 22 is formed in a trench structure. The trench is roughly diamond shaped in the plan view, and in the preferred embodiment is hexagonally shaped. The storage capacitor includes a signal electrode 24, consisting of an N-type or intrinsic polysilicon area, which is coupled to one plate of the capacitor 22. This plate of capacitor 22 is formed by a first N-type polysilicon area 23 and a second polysilicon area 25, which may be N-type or intrinsic polysilicon.

The other plate of the capacitor is formed by an N-type diffusion area 21 surrounding the lower polysilicon area 23, as indicated by the dashed lines in FIG. 2. As can be seen from FIG. 2, the N-type diffusion areas 21 from all the trenches merge together to form the common electrode for all the storage capacitors 22. This common electrode for all the storage capacitors is coupled to a source of a reference potential (not shown). The dielectric for the trench capacitor 22 is formed by a thin insulating layer 27 on the wall of the trench 22 surrounding the first polysilicon area 23, and a thicker oxide collar 29 on the wall of the trench 22 surrounding the second polysilicon area 25. The N-type diffusion area 21 forms a P-well 31 surrounding the trench capacitor 22 within which the unit cell FET is formed.

A planar FET 26 is formed on the surface of the substrate 10. A buried strap 28, formed by an N-type diffusion area, forms the source electrode of the FET 26, and is coupled to the signal electrode 24 of the storage capacitor 22. Another N-type diffusion area 30 forms the drain electrode of the FET 26. An insulating layer 34 forms the gate insulator of the FET 26, and a gate electrode 36 is formed by the portion of the polysilicon word line, illustrated as a dashed line 36 in FIG. 1, atop the insulating layer 34.

A nitride insulating layer 40 is formed atop the storage capacitor 22 and gate electrode 36, and a thicker oxide layer 46 formed over that. A drain contact area 42 is formed atop the drain diffusion area 30. A polysilicon contact layer 43 is formed over the drain diffusion area 30 and a tungsten contact 44 is formed atop the polysilicon contact layer 43. A metal contact 48, illustrated as a dashed line in FIG. 1 and as cross-hatched in FIG. 2, formed as part of the first metalization layer, connects the bit line contacts (43,44) in the unit cells forming a column to the external read/write circuitry..

To define the extent of the buried strap 28 and drain diffusion area 30, a shallow trench isolation (STI) oxide area 50 is formed over all areas of the unit cell 20 except an active area, indicated in the plan view of FIG. 1 as a crosshatched area AA. The STI overlays a portion of the trench capacitor, and is isolated from the trench capacitor by an insulating layer 52.

As can be seen from FIG. 2, the insulating layer 34 and gate electrode 36 overlap the trench capacitor 22. This arrangement permits the word line 38 to have the necessary cross section area, but allows for a decrease in the surface area of the substrate 10 required by the unit cell 20. The buried strap 28 forms a smaller area junction, which leads to reduced junction leakage. This decreases the charge loss from the storage capacitor 22, and improves the performance of the unit cell by lengthening the refresh period required by the unit cell.

In operation, when the word line 36 is activated, the FET 26 becomes conductive, coupling the signal electrode 24 of the storage capacitor 22 to the bit line 48. Other circuitry in the semiconductor memory chip may then either supply charge to the storage capacitor 22 (in a write operation) or sense the charge which had been previously stored in the storage capacitor 22 (in a read operation). Such operation is well known.

Figure 3:
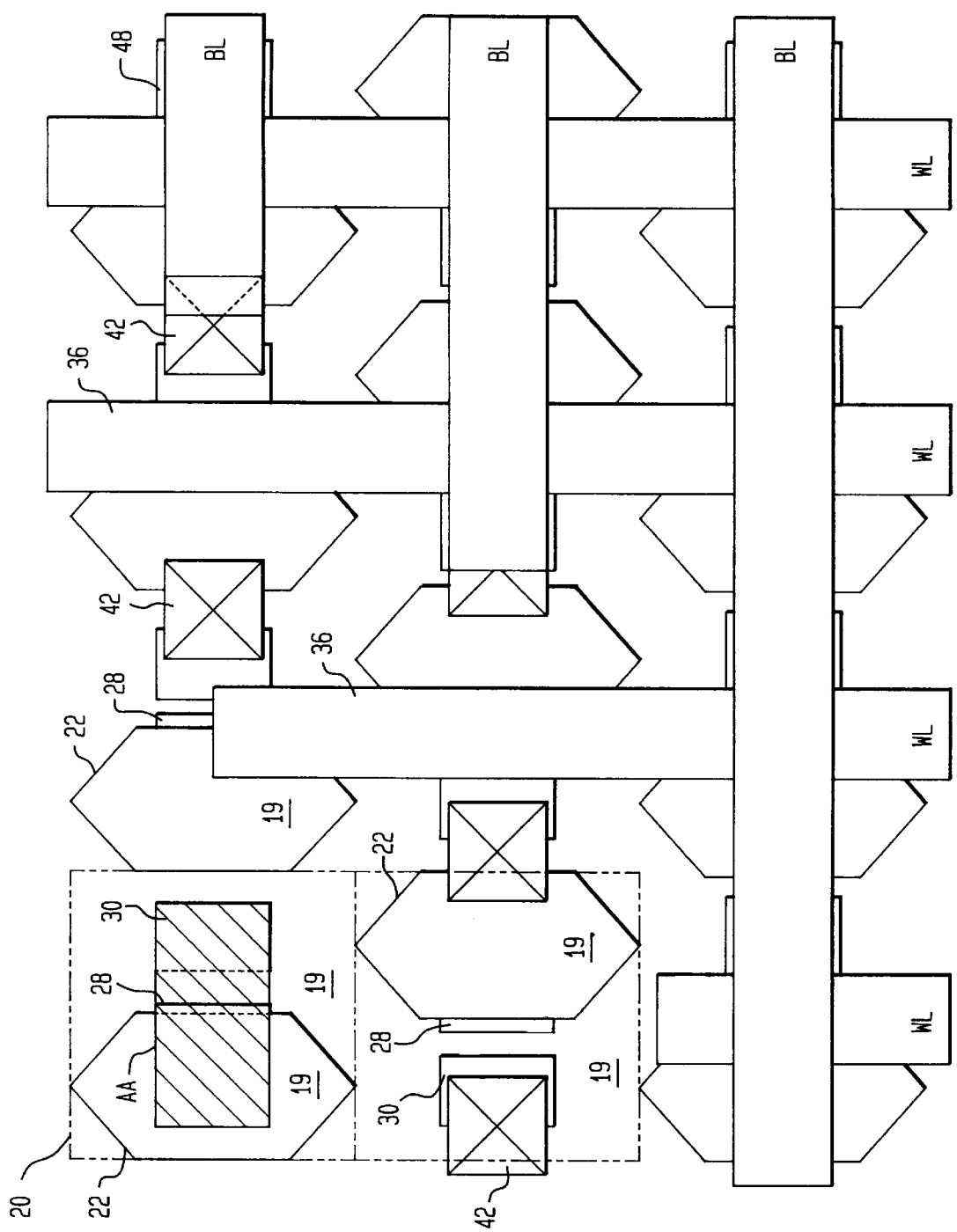
FIG. 3 is a plan view of an array of unit cells as illustrated in FIGS. 1 and 2.

FIG. 3 is a plan view of a preferred arrangement of a portion of an array of unit cells as illustrated in FIGS. 1 and 2. FIG. 3 is a cut-away view of the array which illustrates the manner in which the word lines 36 and bit lines 48 overlap respective unit cells in the array, and each other. Elements corresponding to those in FIGS. 1 and 2 are designated by the same reference numbers, and are not described in detail below.

In the top left corner of FIG. 3 a unit cell 20 is illustrated in a similar manner as in FIG. 1. Another unit cell is located immediately to the right. This unit cell shows a cut-away word line (WL) 36 partially overlying the junction area between the source 28 and drain 30 diffusions of that unit cell's FET. It can also be seen that the word line 36 partially overlaps that unit cell's trench capacitor 22. The word line 36 lies atop the gate insulating layer (not shown). This unit cell also shows its drain contact area 42.

The next unit cell to the right shows its word line 36 completely overlying that unit cell's FET, and shows a cut-away bit line (BL) 48 partially overlying this unit cell's drain electrode contact area 42. The bit line 48 electrically contacts the drain region 30 through tungsten contact 44 and polysilicon contact layer 43, as illustrated in FIG. 2 and described above. The unit cells for which a single bit line is connected to the drain electrode of their FET is termed a column in the memory array.

The next lower row of unit cells 20 are arranged congruently to the unit cells of the topmost row, but are rotated 180°. This may be seen by comparing the leftmost unit cell 20 in the topmost row to that in the second row (immediately below it) in which the storage capacitor 22 is to the right, the source diffusion area 28 is to the left of the storage capacitor 22, and the drain diffusion area 30 and contact area 42 are to the left of the source diffusion area 28. This middle row of unit cells forms a second column of unit cells, and the bottommost row forms a third column. There are other columns (not illustrated) which are physically arranged above and below those illustrated in FIG. 3.

Each word line (WL) is arranged atop the respective FETs of corresponding unit cells in the columns, as illustrated in FIG. 3. The unit cells for which a single word line forms the gate electrode for their FET is termed a row in the memory array. There are other rows (not illustrated) which are physically arranged to the right and left of those illustrated in FIG. 3. The remaining unit cells in the illustrated portion of this memory array illustrate that the word lines (WL) are arranged beneath the bit lines (BL), and in the bottom right hand corner show how a complete memory array appears.

In operation, memory address circuitry on the semiconductor memory chip (not shown) activates a selected one of the word lines (WL) in response to external address signals supplied to the chip, in a known manner. The FETs of all of the unit cells coupled to the activated word line become conductive, coupling the signal electrode of the associated storage capacitors to the associated bit lines. Then, either write circuitry on the chip (not shown) supplies appropriate charges for the storage capacitors coupled to the respective bit lines in response to external data signals, or sense amplifiers (also not shown), coupled to the bit lines, are responsive to the previously stored charge in the storage capacitor to supply data to external circuitry, in a known manner.

From FIG. 3 it is apparent that the limiting constraint on reducing the size of an array of illustrated unit cells, is the distance between adjacent trench capacitors (termed the trench pitch), and not the distance between adjacent bit lines or word lines. It is also apparent that by forming the trenches substantially diamond shaped, or in the illustrated preferred embodiment hexagonally shaped, it is possible to arrange the trenches even closer together, especially from row to row.

FIGS. 4 through 9 illustrate cross-sectional views of the substrate 10 at succeeding phases during the fabrication of a unit cell as illustrated in FIGS. 1 and 2. Referring to FIG. 4, first a trench 22 is etched, to a depth of about 7–8 microns in the substrate 10 in a known manner. Then a thin layer of N-doped arsenic-glass (ASG) is applied to the exposed surface of the substrate 10, including the sidewalls and bottom of the trench 22. The trench 22 is then filled with photoresist. The photoresist is etched down to a depth just above the intended depth of the bottom of the insulating collar 29, which is about 1–2 microns. The ASG which remains exposed, on the surface of the substrate and on the upper portion of the sidewalls of the trench 22, is then etched away. Then the photoresist remaining at the bottom of the trench is etched away. What remains is a trench 22 with a thin layer of N-doped ASG on the bottom and lower portion of the sidewalls of the trench 22, extending downward from just above the intended depth of the bottom of the insulating collar 29.

The substrate 10 is then subjected to a heat cycle to form the N-type outdiffusion 21 forming the common plate of all the trench capacitors 22. Any remaining ASG is then removed from trench 22. A thin insulating layer 27 is then applied to the sidewalls and bottom of the trench 22. The trench is then filled with the N-doped polysilicon which will form the first polysilicon area 23. The N-doped polysilicon is etched to a depth of about 1–2 microns within the trench to form the N-type first polysilicon layer 23. An insulating oxide layer is then formed on the exposed surfaces of the substrate 10 (on and above the first polysilicon layer 23), which is then directionally etched vertically to remove the oxide on the horizontal surfaces. The oxide remaining forms the insulating collar 29 on the sidewalls of the trench 22. The remaining open area in the trench is then filled with either N-type or intrinsic polysilicon which will form the second polysilicon layer 25. The cross-sectional view of the substrate at this stage in the fabrication process is illustrated in FIG. 4. At this point, the trench capacitor 22 is completely formed with the common plate formed by the N-type outdiffusion 21, the dielectric formed by the thin insulating layer 27 and the insulating collar 29, and the second plate formed by the first 23 and second 25 polysilicon layers.

A recess is then etched to a depth of about 150 nanometers (nm) in both the insulating collar 29 and second polysilicon area 25. This recess is filled with either an N-type or intrinsic polysilicon layer 24 forming the signal electrode of the trench capacitor 22. The cross-sectional view of the substrate 10 at this stage in the fabrication is illustrated in FIG. 5.

A shallow recess is etched to a depth of about 50 nm into the signal electrode polysilicon layer 24 of the trench capacitor 22. Then a deeper recess for the shallow trench isolation 50 is etched into the substrate 10 surrounding the active area (AA of FIG. 1). The exposed surface of the substrate is covered with an oxide layer 52. The substrate is then planarized leaving an insulating layer 52 atop the signal electrode 24 of the trench capacitor 22 and the shallow isolation trench 50. The cross-sectional view of the substrate 10 at this stage in the fabrication is illustrated in FIG. 6.

A TEOS oxide layer is applied to the exposed surface of the substrate 10, and the substrate is then planarized. The result is the filling of the shallow trench isolation 50 with TEOS oxide. A layer of gate oxide 34 followed by a layer of gate polysilicon, which may be N-type or P-type, is then applied to the surface of the substrate. These are then masked and etched to form the gate insulating layer 34 and gate electrode 36 in the form of the word lines (WL) 36 illustrated in FIG. 3. A self-aligned drain region is fabricated using the word lines 36 as one portion of the mask, and the STI oxide 50 as the other portion, and making an N-doped implantation 54 in the drain contact area 42. The cross-sectional view of the substrate 10 at this stage in the fabrication is illustrated in FIG. 7.

Figure 7:
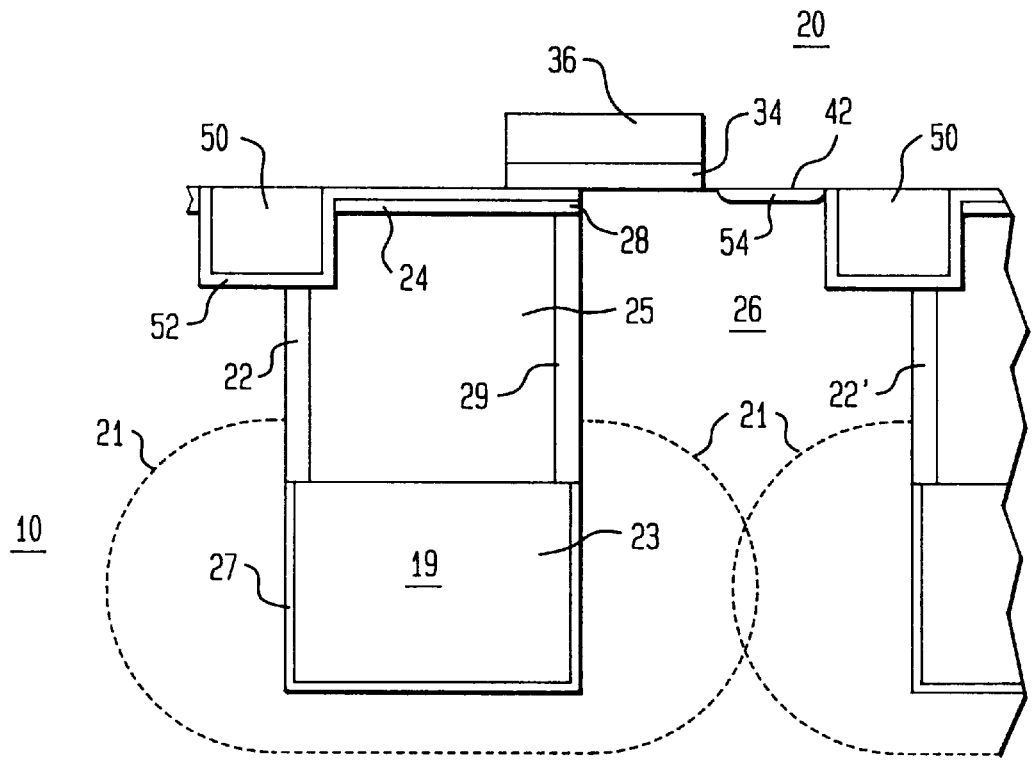

The substrate as illustrated in FIG. 7 is then heat treated. The N-doped drain implantation 54 outdiffuses to form the drain electrode 30, and the exposed portion of the trench capacitor 22 signal electrode 24 polysilicon layer outdiffuses to form the buried strap 28. The various oxide layers prevent any outdiffusion through them, so the only diffusion occurs in the active area (AA of FIG. 1), specifically the drain region 30 and the buried strap 28 through the exposed portion of the signal electrode 24 of the trench capacitor 22. The buried strap 28 outdiffuses to the surface of the substrate and forms the source region of the FET 26.

Figure 8:
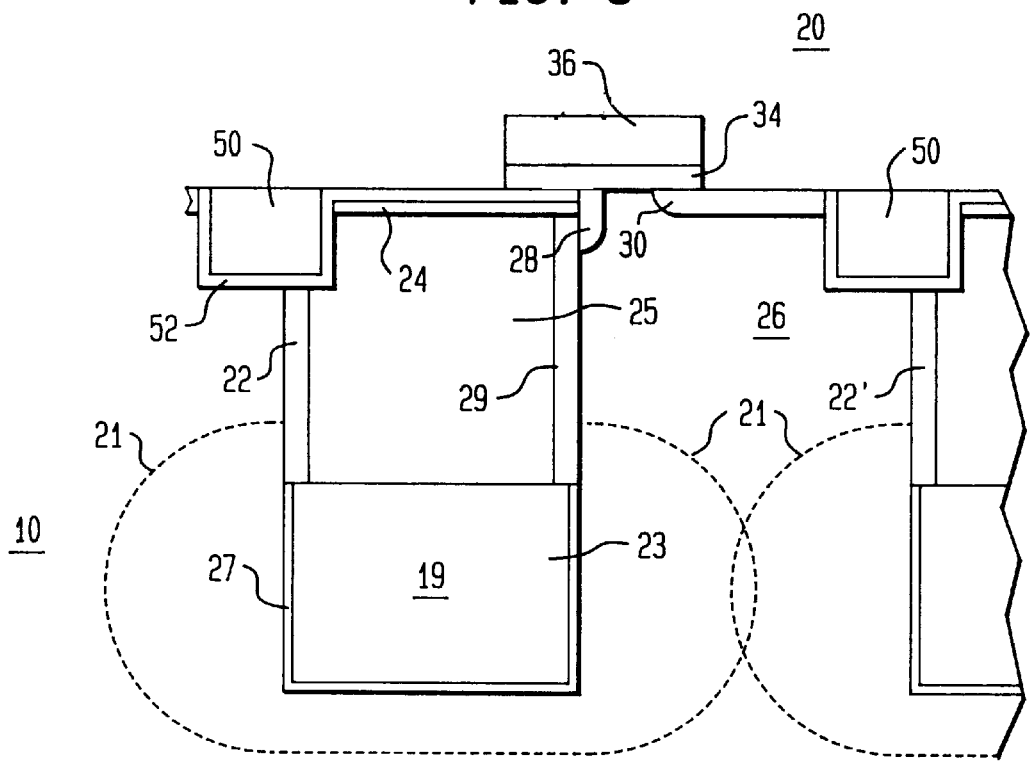
Figure 9:
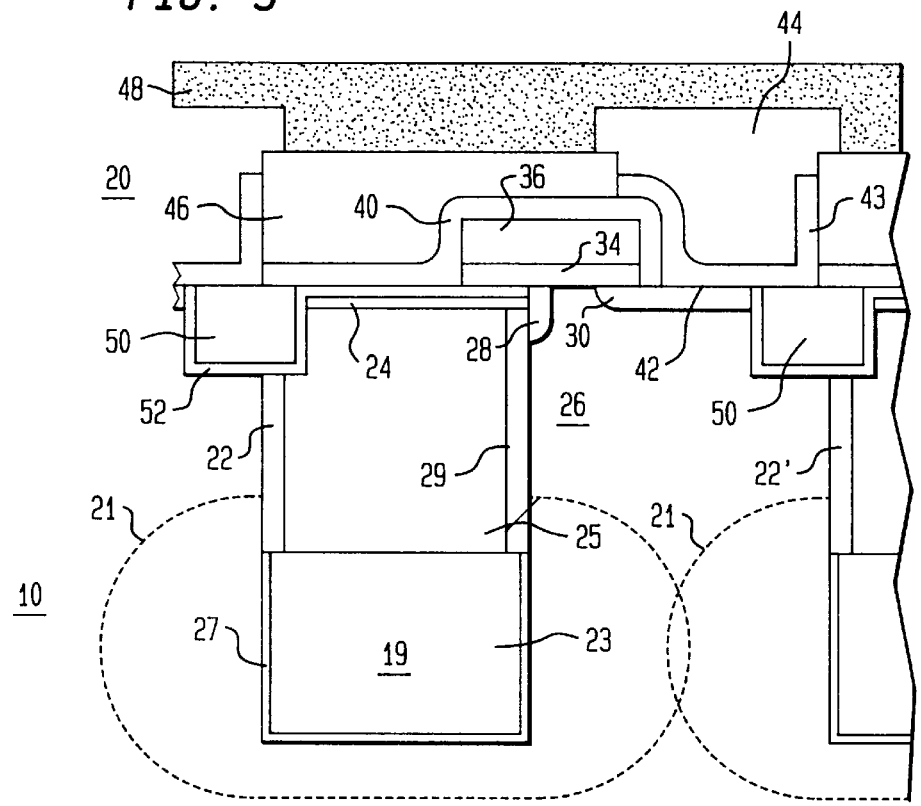

The extent of the outdiffused buried strap 28 may be controlled by both the temperature of the heat treatment, and the doping concentration of the three polysilicon areas (23, 25 and 24) within the trench capacitor 22. In a preferred embodiment, polysilicon area 23 is highly doped, polysilicon area 25 is lightly doped, and polysilicon area 24 is intrinsic. In this way, during the heat treatment, the highly doped polysilicon area 23 outdiffuses through the lightly doped polysilicon area 25 and through the intrinsic polysilicon area 24 into the surrounding P-well in a relatively slow controllable manner. The cross-sectional view of the substrate 10 at this stage in the fabrication is illustrated in FIG. 8.

An insulating nitride layer 40 is deposited atop the exposed portions of the substrate 10 and a thick oxide layer 46 is deposited atop the nitride layer 40. The thick oxide layer 46 is then planarized. Contact holes are formed to give access to the drain contact areas 42 of the FETs. The contact holes are masked and etched through the thick oxide layer 46. Then the nitride layer 40 is directionally etched, exposing the drain contact area 42. A thin polysilicon layer 43 is applied to the contact area 42 and a portion of the sidewalls of the contact hole. Then a tungsten contact 44 is deposited atop the polysilicon contact layer 43. Because the thin polysilicon layer 43 is used to directly contact the drain contact area 42, only a small contact area is necessary to provide the proper electrical contact. The bit line (BL) 48 (illustrated in FIG. 3) is then applied as a portion of the first metalization layer, and connects the tungsten contacts 44 of all the unit cells 20 in the memory column. The bit line 48 is deposited atop the thick oxide layer 46, contacting the tungsten contact 44, and may be composed of aluminum. This completes the fabrication of the unit cell illustrated in FIGS. 1, 2 and 3.

Figure 10:
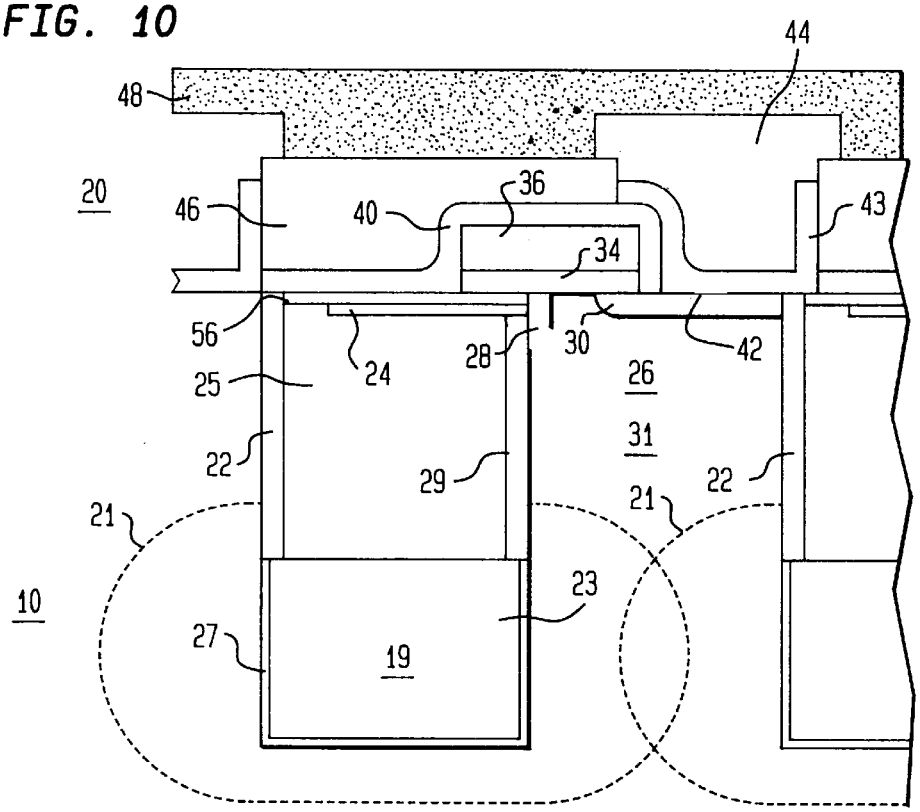
FIG. 10 is a cross section view of another embodiment of a unit cell according to the present invention.

FIG. 10 is a cross-section view of a second embodiment of a unit cell according to the present invention. Elements which are similar to those illustrated in FIGS. 1 through 10 are designated by the same reference number and will not be discussed in detail below. In FIG. 10 there is no shallow trench isolation (50 in FIG. 2). Instead, the polysilicon signal electrode layer 24, which will be outdiffused to form the buried strap 28, is fabricated to extend only part way across the trench capacitor 22. The insulating collar 29 extends all the way to the surface of the substrate 10 in the location where the STI was in the embodiment illustrated in FIG. 2. In addition, an insulating oxide layer 56 is deposited completely across the top of the trench capacitor 22. The operation of the unit cell illustrated in FIG. 10 is the same as that for the unit cell illustrated in FIGS. 1 and 2, and an array of unit cells illustrated in FIG. 10 are arranged in the same manner as illustrated in FIG. 3, and operate in the same manner.

Figure 11:
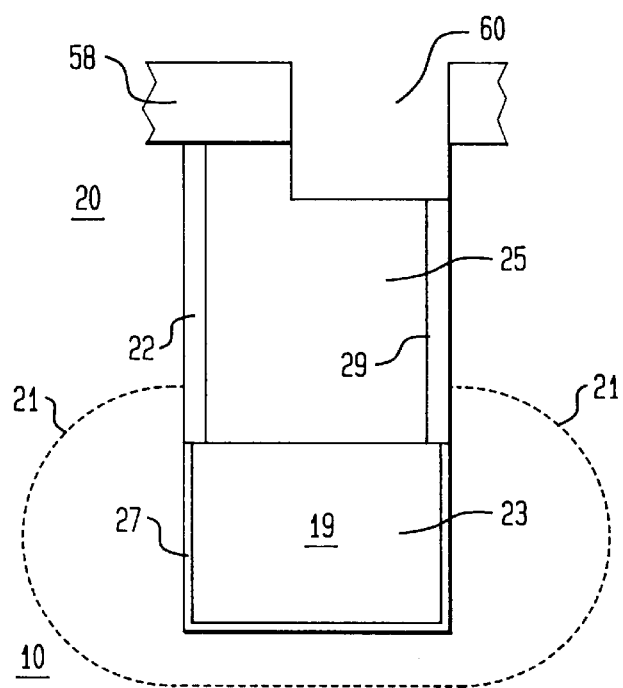
FIGS. 11 and 12 are cross section views of stages of fabrication of a unit cell as illustrated in FIG. 10 which differ from the stages illustrated in FIGS. 4 through 9.
Figure 12:
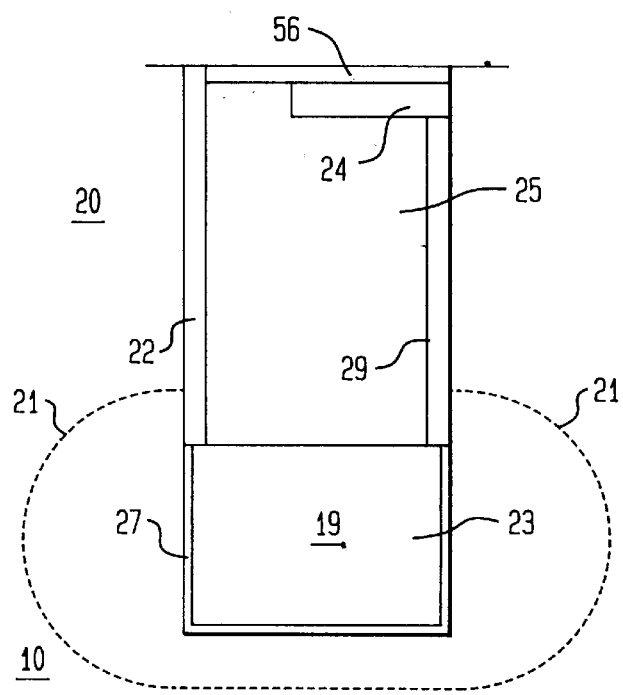

The fabrication of the unit cell illustrated in FIG. 10 is slightly different than that for the unit cell illustrated in FIGS. 1 and 2. FIGS. 11 and 12 illustrate fabrication steps which are different from the series of steps illustrated in FIGS. 4 through 9. Fabrication of a unit cell as illustrated in FIG. 10 begins with the same series of steps resulting in a substrate as illustrated in FIG. 4. At this point, the processing differs.

Referring to FIG. 11, a mask 58 for the signal electrode 24 is applied to the surface of the substrate 10. A recess 60 is then etched through the mask to a depth of about 150 nm into the second polysilicon area 25 and insulating collar 29. The cross-sectional view of the substrate 10 at this stage in the fabrication is illustrated in FIG. 11.

The mask 58 is then removed, and the recess 60 is filled with an N-type or intrinsic polysilicon which will form the signal electrode 24 of the trench capacitor 22. Another recess is then masked and etched to a depth of about 50 nm across the top of the newly applied polysilicon and the exposed top of the trench capacitor 22. An insulating oxide layer 56 is then applied to the exposed top of the substrate 10, and the substrate is planarized. The cross-sectional view of the substrate 10 at this stage in the fabrication is illustrated in FIG. 12.

The stage of fabrication illustrated in FIG. 12 is roughly similar to that illustrated in FIG. 6 for the first embodiment. The substrate 10 illustrated in FIG. 12 is ready for the application of the gate oxide 34 and gate polysilicon 36 and implantation of the drain region 54 (cf. FIG. 7); heat treatment to form the buried strap 28 and drain region 30 (cf. FIG. 8); and application of the nitride layer 40, oxide layer 46, drain contacts (43,44) and bit lines 48 (FIG. 10).

The embodiment, described above, is illustrative of a DRAM unit cell which may be fabricated in accordance with the present invention. An N-type substrate may be used, and different dimensions, doping types and concentrations may also be used to form such a unit cell. In addition, the shape of the trench capacitor does not need to be hexagonal; other shapes may be used, still in accordance with the present invention. An advantage of a unit cell according to the present invention is that the density of an array of such unit cells is limited by the pitch of the trench capacitors, and not by the pitch of the word lines or bit lines.

We claim:

1. A method for fabricating a DRAM unit cell in a substrate, comprising the steps of:

forming a trench capacitor including a common electrode formed by a buried diffusion, and a signal electrode, by the steps of:

etching a trench in the substrate;

forming the buried diffusion;

applying an insulating layer to an exposed surface of the trench;

filling the trench with a first layer of polysilicon to a depth;

applying an insulating collar to exposed sidewalls of the trench; and filling the trench with a second layer of polysilicon;

wherein the insulating layer and insulating collar form a dielectric of the trench capacitor and the first and second layers of polysilicon form the signal electrode of the trench capacitor;

forming a shallow trench isolation region defining an active area;

forming a planar FET within the active area by the steps of:

applying a planar word line atop a gate insulator over the active area, and partially overlapping the trench capacitor;

implanting a drain doping; and heat treating the substrate to form a buried strap source diffusion from the signal electrode of the trench capacitor and a drain diffusion;

applying an insulating layer on a top of the substrate;

forming a drain contact; and applying a bit line in contact with the drain contact.

2. The method of claim 1 further comprising, after the step of filling the trench with the second layer of polysilicon, the steps of:

removing a portion of the second layer of polysilicon, and the insulating collar, from the trench to a second depth;

filling the trench with a third layer of polysilicon;

wherein the first, second and third layers of polysilicon form the signal electrode of the trench capacitor.

3. The method of claim 1, wherein the step of forming a shallow trench isolation region comprises the steps of:

removing a top portion of the trench capacitor to a first depth;

removing a top portion of the substrate surrounding the active area to a second depth;

applying an insulating layer to the substrate having a thickness at least equal to the first depth;

planarizing the substrate;

applying a TEOS oxide layer having a thickness at least equal to the second depth; and planarizing the substrate.

4. The method of claim 1, wherein the step of forming a gate electrode comprises the steps of:

applying a gate insulating layer to the top of the substrate;

applying a gate electrode polysilicon layer to a top of the gate insulating layer;

masking the gate electrode;

removing unmasked portions of the gate insulating and gate electrode polysilicon layers.

5. The method of claim 1, wherein the step of implanting the drain doping comprises the step of self-aligning the drain doping using the gate electrode as a first portion of a mask and the shallow trench isolation region as a second portion of the mask.

6. The method of claim 1, wherein the step of forming a drain contact comprises the steps of:

etching a contact hole in the insulating layer on the top of the substrate to the drain diffusion;

applying a layer of polysilicon to a bottom and sidewalls of the contact hole; and filling the contact hole with tungsten to form the drain contact.

7. The method of claim 1 wherein the step of forming the buried diffusion comprises the steps of:

applying a dopant to an exposed surface of the substrate;

filling the trench with photoresist;

removing a portion of the photoresist in the trench to a depth;

removing exposed dopant;

removing remaining photoresist;

heat treating the substrate to form the buried diffusion which forms the common electrode of the trench capacitor.

* * * * *